(12) United States Patent
Liu

(10) Patent No.: US 6,414,557 B1
(45) Date of Patent: Jul. 2, 2002

(54) HIGH NOISE REJECTION VOLTAGE-CONTROLLED RING OSCILLATOR ARCHITECTURE

(75) Inventor: Bin Liu, Danville, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 09/507,114

(22) Filed: Feb. 17, 2000

(51) Int. Cl.[7] ................................................. H03B 5/02
(52) U.S. Cl. .......................... 331/57; 327/261; 327/266; 327/272; 327/274
(58) Field of Search ............................ 331/57; 327/261, 327/266, 272, 274

(56) References Cited

U.S. PATENT DOCUMENTS

| | | | |
|---|---|---|---|
| 5,072,197 A | 12/1991 | Anderson | 331/57 |
| 5,075,643 A | 12/1991 | Einbinder | 331/117 R |
| 5,175,512 A | 12/1992 | Self | 331/57 |
| 5,300,898 A | 4/1994 | Chen et al. | 331/57 |
| 5,331,295 A | 7/1994 | Jelinek et al. | 331/57 |
| 5,418,498 A | 5/1995 | De Vito et al. | 331/57 |
| 5,559,476 A | 9/1996 | Zhang et al. | 331/57 |
| 5,581,216 A | 12/1996 | Ruetz | 331/57 |
| 5,673,323 A | 9/1997 | Schotz et al. | 381/2 |
| 5,686,867 A | 11/1997 | Sutardja et al. | 331/57 |
| 5,764,110 A | 6/1998 | Ishibashi | 331/57 |
| 5,821,824 A | * 10/1998 | Mentzer | 331/57 |
| 5,847,616 A | 12/1998 | Ng et al. | 331/57 |
| 5,864,258 A | 1/1999 | Cusinato et al. | 331/34 |
| 5,945,883 A | 8/1999 | Nagasawa et al. | 331/57 |
| 5,955,929 A | 9/1999 | Moon et al. | 331/57 |
| 5,973,573 A | 10/1999 | Iravani et al. | 331/57 |
| 5,994,968 A | 11/1999 | Iravani et al. | 331/57 |

FOREIGN PATENT DOCUMENTS

EP   0 068 928   1/1983

OTHER PUBLICATIONS

Lee, Seog–Jun, Kim, Beomsup, and Lee Kwyro, "A Fully Integrated Low–Noise 1–GHz Frequency Synthesizer Design for Mobile Communication Application, " IEEE Journal of Solid–State Circuits, May 1, 1997, pp. 760–765, vol. 32, No. 5, ISSN: 0018–9200, IEEE, USA.
PCT International Search Report; Mailed May 18, 2001; Appl. No. PCT/US 01/01987; Filed Jan. 22, 2001.
F. Herzel et al., "A Study of Oscillator Jitter Due to Supply and Substrate Noise", IEEE Transactions on Circuits and Systems–II: Analog and Digital Signal Processing, vol. 46, No. 1, Jan. 1999.

* cited by examiner

*Primary Examiner*—Arnold Kinkead
(74) *Attorney, Agent, or Firm*—Christie, Parker & Hale, LLP

(57) ABSTRACT

A ring oscillator circuit, such as a VCO, with a relatively high level of noise rejection for noise originating from both the voltage supply and ground. The ring oscillator circuit is composed of a plurality of differential delay circuits, each differential delay circuit generating a differential output signal that is a delayed (and preferably inverted) version of a differential input signal. Each differential delay circuit includes first and second input transistors for receiving the differential input signal. Each differential delay circuit also includes first and second load transistors coupled in parallel with the respective first and second input transistors. Each differential delay circuit further includes a first current source coupled between the first input transistor and a first power supply terminal (e.g., a voltage supply terminal), a second current source coupled between the second input transistor and the first power supply terminal and a third current source coupled between the first and second input transistors and a second power supply terminal (e.g., a ground terminal). The first and second current sources reduce the coupling of noise from the first power supply terminal to the output. The third current source reduces the coupling of noise from the second power supply terminal to the output.

33 Claims, 4 Drawing Sheets

CONVENTIONAL DIFFERENTIAL INVERTER

CONVENTIONAL DIFFERENTIAL INVERTER

HIGH NOISE REJECTION VOLTAGE-CONTROLLED RING OSCILLATOR ARCHITECTURE

BACKGROUND OF THE INVENTION

1. Field of the Invention

This invention relates generally to ring oscillator circuits and, in particular, to a ring oscillator or VCO circuit that provides an improved level of noise rejection for noise originating from both the voltage supply and ground.

2. Description of the Related Art

High-speed digital circuits such as microprocessors and memories often employ a phase-locked loop (PLL) circuit to suppress timing skews between the on-chip clock and the system clock. PLL circuits typically include a voltage-controlled oscillator (VCO) circuit to generate a periodic digital signal. FIG. 1 shows a conventional VCO circuit 100. The VCO 100, which is a type of ring oscillator, and consists of N stages of differential inverters 110 with the output of the Nth stage connected back to the input of the first stage. The VCO circuit 100 generates an output signal VCO_out, which is a periodic digital signal having a frequency that is adjustable by varying the voltage of the frequency control signal Vctrl.

The PLL circuit is typically fabricated on the same integrated circuit as the digital circuit and as a result, the switching noise generated by the digital circuit is coupled to the PLL, including the VCO 100. The switching noise is coupled to the PLL circuit through various sources, including the voltage supply VDD, the ground GND and the substrate. The coupling of noise to the VCO 100 causes the output signal VCO_out to suffer from jitter (i.e., rapid variations in phase), thereby reducing the accuracy of the PLL.

A conventional approach to reducing the effect of switching noise is to construct the VCO 100 with differential, rather than single-ended, inverters 110 so that the switching noise is rejected by the inverters as common-mode noise. However, under the large-signal conditions under which most VCOs operate, the differential inverters of the VCO may function as a mixer so as to combine the common-mode noise with the differential signal. Consequently, despite its differential operation, the VCO 100 at least partially couples the switching noise to its output.

Another conventional approach is to isolate the inverters from the noise source by placing a high-impedance current source between the noise source and the inverter, as shown in FIGS. 2 and 3. FIG. 2 shows a differential inverter 210 including n-type MOSFET input transistors 211 and 212 and p-type MOSFET load transistors 213 and 214 connected in a conventional differential inverter configuration. The load transistors 213 and 214 are diode-connected with the gate of the transistor connected to the drain. The differential inverter 210 also includes a current source 216 placed between ground and the input transistors 211 and 212. The current source 216 reduces the coupling of noise from ground because of its high impedance relative to the impedance of the ground. Similarly, FIG. 3 shows a differential inverter 310 including PMOS input transistors 311 and 312 and n-type MOSFET load transistors 313 and 314. The differential inverter 310 also includes a current source 315 placed between the voltage supply VDD and the input transistors 311 and 312. The current source 315 reduces the coupling of noise from the voltage supply VDD because of its high impedance relative to the impedance of VDD.

A disadvantage of the differential inverters 210 and 310 is that they are capable of rejecting noise from only one of the potential switching noise sources VDD and ground, but not both. Consequently, switching noises originating from the other supply (i.e., VDD for the differential inverter 210 and ground for the differential inverter 310) can still affect the output of the differential inverter, thereby causing jitter in the output signal VCO_out.

In view of the shortcomings of these approaches, it is an object of the present invention to provide a VCO circuit with an improved level of noise rejection for noise originating from both the voltage supply and ground, i.e., an improved power supply rejection ratio (PSRR).

SUMMARY OF THE INVENTION

The present invention comprises a ring oscillator circuit, such as a VCO, with a relatively high level of noise rejection for noise originating from both the voltage supply and ground. The ring oscillator circuit is composed of a plurality of differential delay circuits, each differential delay circuit generating a differential output signal that is a delayed (and preferably inverted) version of a differential input signal. Each differential delay circuit includes first and second input transistors for receiving the differential input signal. Each differential delay circuit also includes first and second load transistors coupled in parallel with the respective first and second input transistors. Each differential delay circuit further includes a first current source coupled between the first input transistor and a first power supply terminal, a second current source coupled between the second input transistor and the first power supply terminal and a third current source coupled between the first and second input transistors and a second power supply terminal. In a preferred embodiment of the invention, the first power supply terminal consists of a voltage supply terminal and the second power supply terminal consists of a ground terminal. In other embodiments, however, the first and second power supply terminals may be reversed.

The ring oscillator circuit of the present invention provides an improved level of noise rejection over prior art VCO circuits because the inventive differential delay circuit rejects noise originating from both the voltage supply and ground. Specifically, the first and second current sources reduce the coupling of noise from the first power supply terminal to the output, while the third current source reduces the coupling of noise from the second power supply terminal to the output.

These and other features and advantages of the invention will be better appreciated from the following detailed description of the invention together with the appended drawings.

DETAILED DESCRIPTION OF THE PREFERRED EMBODIMENTS

The present invention comprises a ring oscillator circuit, such as a VCO, with an improved level of noise rejection for noise originating from both the voltage supply and ground, i.e., an improved PSRR. As a result, the output signal generated by the ring oscillator circuit suffers from less jitter than conventional ring oscillator or VCO circuits in the presence of such noise. Consequently, the ring oscillator of the present invention is especially suitable for use as a VCO in integrated circuits that include digital circuits, such as microprocessors or digital signal processors (DSPs). The following description is presented to enable any person skilled in the art to make and use the invention, and is provided in the context of a particular application and its requirements. Various modifications to the preferred embodiment will be readily apparent to those skilled in the art, and the generic principles defined herein may be applied to other embodiments and applications without departing from the spirit and scope of the invention. Moreover, in the following description, numerous details are set forth for purpose of explanation. However, one of ordinary skill in the art would realize that the invention may be practiced without the use of these specific details. In other instances, well-known structures and devices are shown in block diagram form in order not to obscure the description of the invention with unnecessary detail. Thus, the present invention is not intended to be limited to the embodiment shown, but is to be accorded the widest scope consistent with the principles and features disclosed herein.

Figure 4:
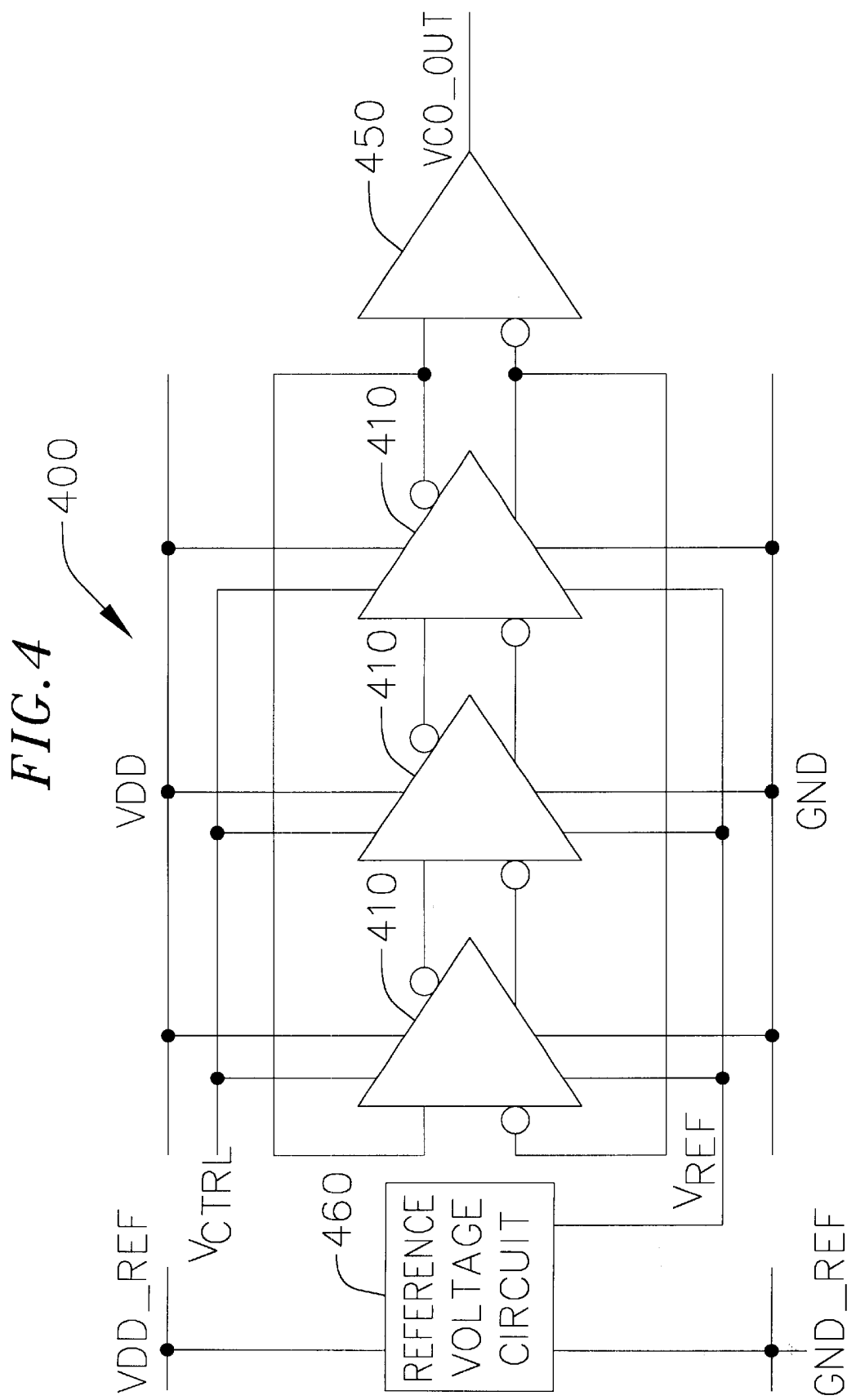
FIG. 4 is a circuit diagram of a VCO circuit in accordance with an embodiment of the present invention.

FIG. 4 shows a ring oscillator, or more specifically, a VCO 400 in accordance with a preferred embodiment of the invention. The overall structure and function of the VCO 400 is similar to that of the conventional VCO 100 described in the background section, except for those features pertaining to voltage supply and ground noise. The VCO 400 includes N stages of differential delay circuits or cells 410, where N is an odd number. In the particular embodiment shown in the figure, N=3. Each differential delay circuit 410 generates an output signal that is an inverted and delayed version of the input signal. The output signal is delayed from the input signal by a phase delay of ΔT. The output of each differential delay circuit 410 is connected to the input of the subsequent differential delay circuit stage, except for the Nth stage. For the Nth stage, the output is connected back to the input of the first differential delay circuit stage.

The VCO 400 generates a periodic digital output signal VCO_out. The frequency f of the output signal VCO_out is a function of the phase delay ΔT of the differential delay circuit 410. Specifically, f=1/(2*N*ΔT). The VCO 400 receives a frequency control signal Vctrl for adjusting the frequency f of the output signal VCO_out. The VCO 400 provides a relatively high level of rejection of noise originating from the voltage supply VDD and ground. As a result, the output signal VCO_out does not suffer significantly from jitter even in the presence of substantial amounts of voltage supply or ground noise.

Each differential delay circuit 410 in a preferred embodiment receives and transmits the following signals:

(1) Differential input signal Vin. The differential input signal Vin is received from the output of the preceding differential delay circuit 410. The differential input signal Vin is a differential signal comprising a first differential input signal component Vin+ and a second differential input signal component Vin−. The first and second differential input signal components Vin+ and Vin− are input to first and second input terminals of the differential delay circuit 410, respectively.

(2) Differential output signal Vout. The differential delay circuit 410 generates the differential output signal Vout, which is an inverted and delayed version of the differential input signal Vin. The differential output signal Vout lags the differential input signal Vin in phase by the phase delay ΔT. The differential output signal Vout is used as the differential input signal Vin for the succeeding differential delay circuit 410. The differential output signal Vout is a differential signal comprising a first differential output signal component Vout− and a second differential output signal component Vout+. The first and second differential output signal components Vout− and Vout+ are output on first and second output terminals of the differential delay circuit 410, respectively. The differential output signal Vout also has a common-mode voltage Vcm. As is known in the art, the common-mode voltage Vcm is the voltage that appears in common at the first and second output terminals with respect to a reference voltage (e.g., ground).

(3) Reference voltage signal Vref. The reference voltage signal Vref is used to adjust the common-mode voltage Vcm of the differential output signal Vout. The reference voltage signal Vref is received from a reference voltage circuit 460, explained below.

(4) Frequency control signal Vctrl. The frequency control signal Vctrl is used to adjust the phase delay ΔT of the differential delay circuit 410 and thus the frequency f of the output signal VCO_out. The frequency control signal Vctrl is generated by a source external to the VCO 400, such as a phase-detector circuit (not shown), which is a circuit well-known in the art, contained within the same PLL circuit as the VCO 400.

The VCO 400 also includes an output buffer 450. The output buffer 450 converts the differential output signal Vout generated by the Nth differential delay circuit 410 into the digital output signal VCO_out.

The VCO 400 further includes a reference voltage circuit 460. The reference voltage circuit 460 generates the reference voltage signal Vref that is supplied to each of the differential delay circuits 410 of the VCO 400. The reference voltage signal Vref is used to adjust the common-mode voltage Vcm of the differential output signal Vout to the desired level. In this embodiment, the reference voltage signal Vref equals the desired common-mode voltage Vcm of the differential output signal Vout. The reference voltage circuit 460 is a type of circuit that is well-known in the art and thus will not be described further.

The differential delay circuits 410 and the reference voltage circuit 460 of the VCO 400 are connected to separate voltage supplies and grounds. The differential delay circuits 410 are connected to a voltage supply terminal VDD and a ground terminal GND. The voltage supply terminal VDD and ground terminal are typically connected to many other circuits and may contain significant amounts of switching noise, especially if connected to or routed near noise-generating digital circuits. The reference voltage circuit 460 is connected to a reference-voltage voltage supply terminal VDD_ref and a reference-voltage ground terminal GND_ref. VDD_ref and GND_ref are usually relatively noise-free because they are typically connected to relatively few other circuits and are routed away from digital circuits and other noise sources.

Figure 5:
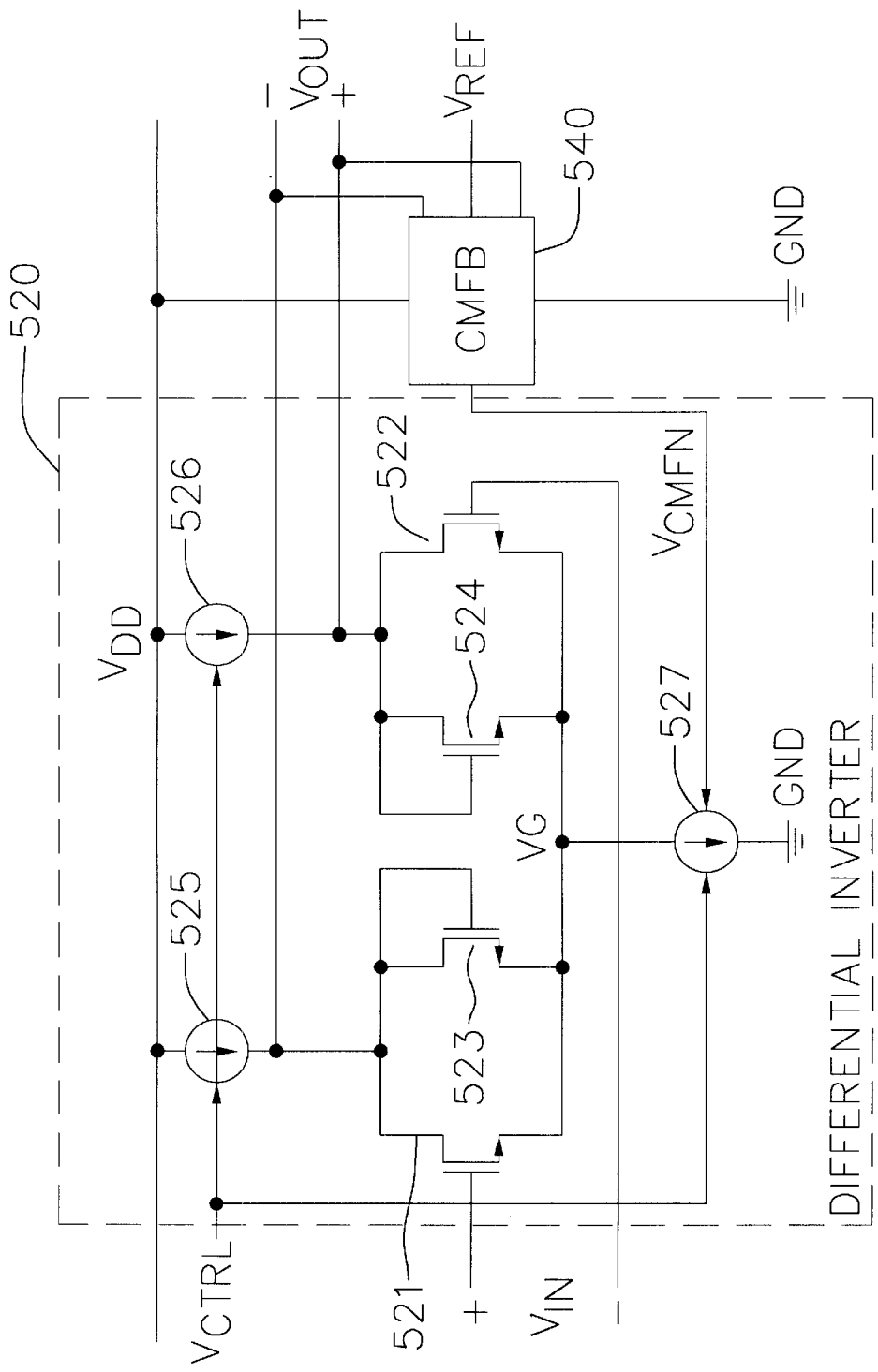
FIG. 5 is a circuit diagram of the differential delay circuit used in the VCO circuit of FIG. 4.

FIG. 5 shows the details of a differential delay circuit 410 of the VCO circuit 400 in accordance with a preferred embodiment of the invention. The differential delay circuit 410 provides a relatively high level of isolation from noise originating from both the voltage supply and ground. Consequently, the VCO output signal VCO_out has a reduced amount of jitter in the presence of such noise. In this embodiment, the differential delay circuit 410 is implemented using CMOS technology. In alternative embodiments of the invention, however, the differential delay circuit 410 may be implemented using other technologies such as silicon bipolar and GaAs HBT.

The differential delay circuit 410 comprises a differential inverter 520 and a common-mode feedback (CMFB) circuit 540. The differential inverter 520 generates the differential output signal Vout that is an inverted and delayed version of the differential input signal Vin. The CMFB circuit 540 is connected in a feedback loop with the differential inverter 520 to adjust the common-mode voltage Vcm of the differential output signal Vout generated by the differential delay circuit, as explained further below.

Figure 1:
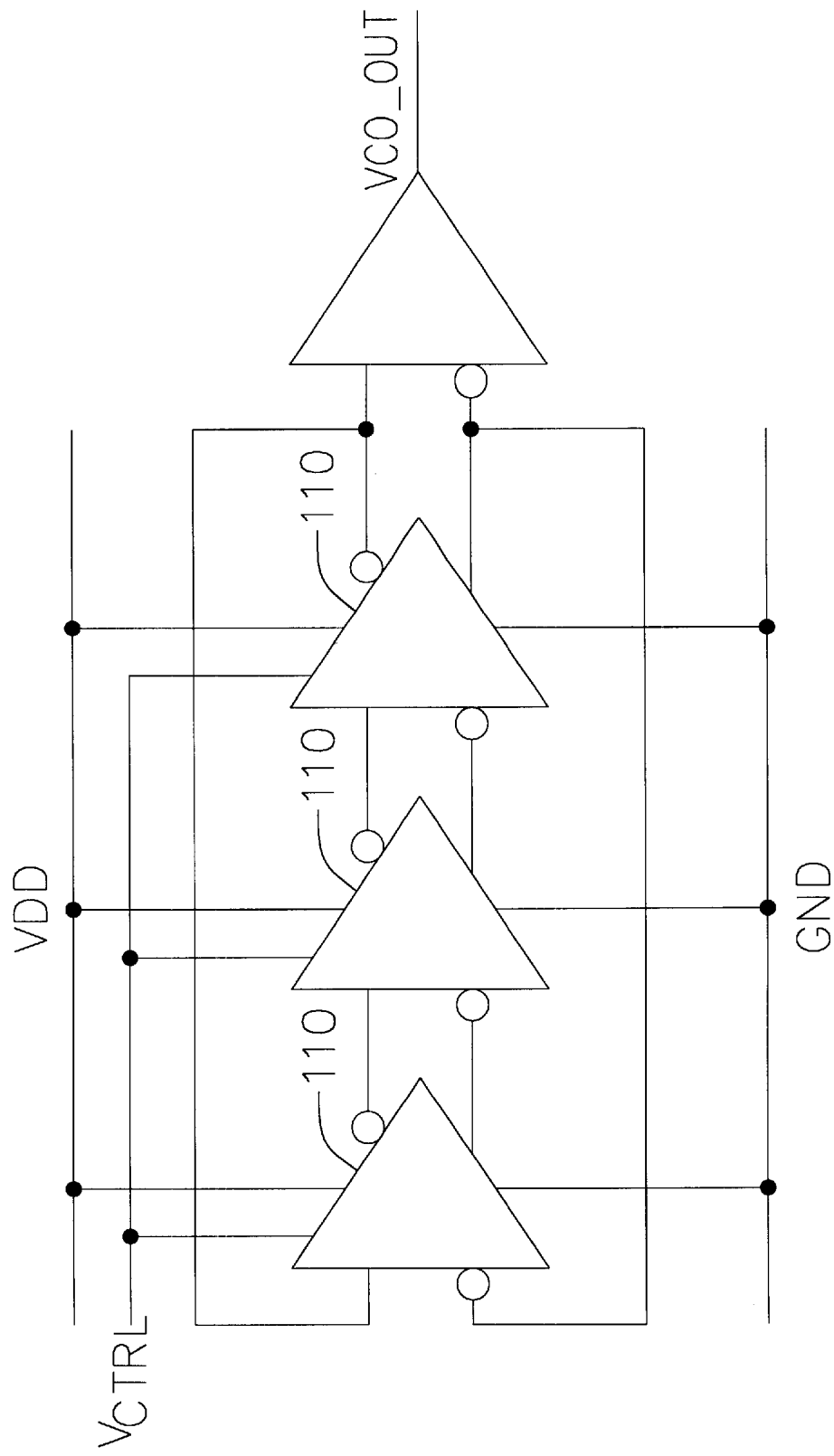
FIG. 1 is a circuit diagram of a conventional VCO circuit.
Figure 2:
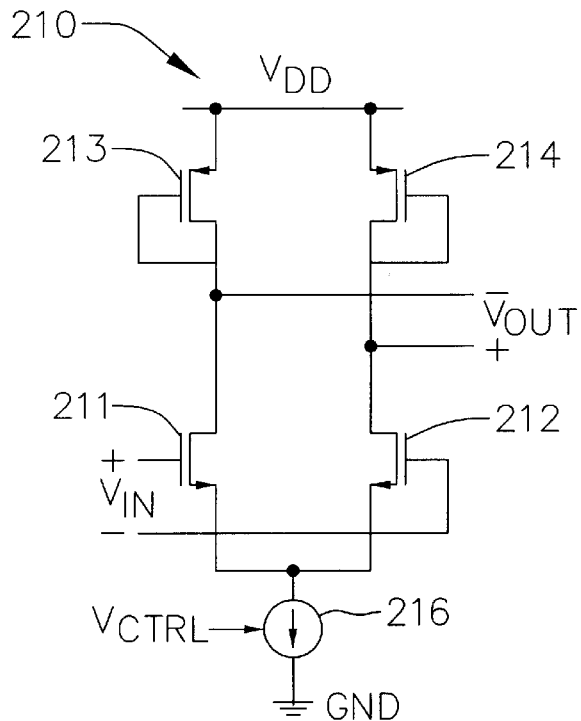
FIGS. 2 and 3 are circuit diagrams of conventional differential inverters used in the VCO circuit of FIG. 1.
Figure 3:
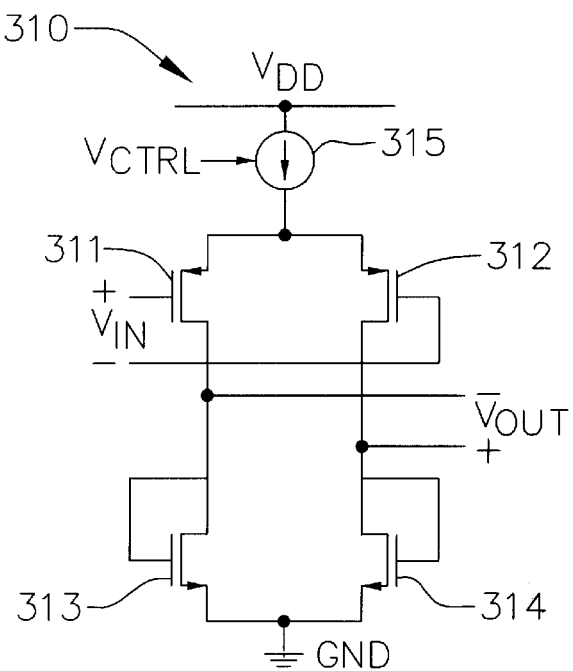

The differential inverter 520 is essentially a modification of a conventional differential inverter, such as the inverter 210 of FIG. 2. Using the differential inverter 210 as an example, the first and second folded load transistors 523 and 524 are formed by changing the load transistors 213 and 214 from p-type MOSFETs to n-type MOSFETs and "folding" them over so that they are no longer connected to the voltage supply terminal VDD but rather, are connected in parallel with the respective input transistors 521 and 522. Two current sources 525 and 526 are then inserted between the folded load transistors 523 and 524 and the voltage supply terminal VDD. The differential output signal Vout of the differential inverter 520 is thus isolated from noise originating from both the voltage supply VDD and ground by the current sources 525, 526 and 527.

In a preferred embodiment of the invention, the differential inverter 520 includes first and second input transistors 521 and 522, first and second folded load transistors 523 and 524 and first, second and third current sources 525, 526 and 527. In this embodiment, the first and second input transistors 521 and 522 and the first and second folded load transistors 523 and 524 each comprise an n-type MOSFET. The first and second current sources 525 and 526 each consist of a p-type MOSFET and the third current source 527 consists of an n-type MOSFET.

In alternative embodiments of the invention, the differential inverter 520 may be implemented using other, logically-equivalent device configurations. For example, the first and second input transistors 521 and 522 and the first and second folded load transistors 523 and 524 may each comprise a p-type, rather than an n-type, MOSFET. In this embodiment, the differential inverter 520 would include one current source consisting of a p-type MOSFET connected to the voltage supply terminal VDD and two current sources each consisting of an n-type MOSFET connected to the ground terminal.

The first and second input transistors 521 and 522 receive the respective first and second differential input signal components Vin+ and Vin− so as to control the differential output signal Vout. The gates of the first and second input transistors 521 and 522 are connected to the respective first and second input terminals (indicated by Vin+ and Vin−, respectively).

The first and second folded load transistors 523 and 524 are diode-connected and thus function as resistive loads for the differential inverter 520. Unlike conventional resistive loads, however, the first and second folded load transistors 523 and 524 are "folded" back on the respective first and second input transistors 521 and 522 to accommodate the respective first and second current sources 525 and 526. The gates of the first and second folded load transistors 523 and 524 are each connected to the drains of the respective transistors to form resistive loads. The first folded load transistor 523 is connected in parallel with the first input transistor 521. Specifically, the drain/gate of the first folded load transistor 523 may be connected to the drain of the first input transistor 521 and the source of the first folded load transistor may be connected to the source of the first input transistor. Similarly, the second folded load transistor 524 is connected in parallel with the second input transistor 522. Specifically, the drain/gate of the second folded load transistor 524 may be connected to the drain of the second input transistor 522 and the source of the second folded load transistor may be connected to the source of the second input transistor.

The first and second current sources 525 and 526 are current sources connected between the voltage supply terminal VDD and the respective input and folded load transistors. Specifically, the first current source 525 is connected between the voltage supply terminal VDD and the drains of the first input transistor 521 and the first folded load transistor 523. The first differential output signal component Vout− is generated at the point where the first current source 525 connects to the drains of the first input transistor 521 and the first folded load transistor 523.

Similarly, the second current source 526 is connected between the voltage supply terminal VDD and the drains of the second input transistor 522 and the second folded load transistor 524. The second differential output signal component Vout+ is generated at the point where the second current source 526 connects to the drains of the second input transistor 522 and the second folded load transistor 524.

The first and second current sources 525 and 526 supply current to and bias the transistors 521 and 522 to the proper region of operation. The first and second current sources 525 and 526 also reduce the coupling of noise from the voltage supply terminal VDD to the output because the impedances of the current sources are higher than the impedance at the voltage supply terminal VDD.

The first and second current sources 525 and 526 each receive the frequency control signal Vctrl to control the amount of current generated by the current sources, thereby varying the phase delay ΔT of the differential delay circuit 410. In the embodiment where the first and second current sources 525 and 526 comprise p-type MOSFETs, the frequency control signal Vctrl is input to the gates of the transistors.

The third current source 527 is a current source connected between the input and folded load transistors and the ground terminal. Specifically, the third current source 527 is connected between the sources of the input transistors 521 and 522 and the folded load transistors 523 and 524 and the ground terminal.

The third current source 527 drains current from and biases the transistors 521 and 522 to the proper region of operation. In a preferred embodiment of the invention, the average current produced by the third current source 527 is approximately twice that produced by each of the first and second current sources 525 and 526. The third current source 527 also reduces the coupling of noise from the ground terminal to the output because the impedance of the third current source is higher than the impedance at the ground terminal.

The third current source 527 receives the frequency control signal Vctrl to control the amount of current generated by the current source, thereby varying the phase delay ΔT of the differential delay circuit 410. In addition, the third current source 527 receives the feedback signal Vcmfb from the CMFB circuit 540 to further adjust the level of generated current. The feedback signal Vcmfb adjusts the current to set the common-mode voltage Vcm of the differential output signal Vout at a level appropriate for the proper operation of the differential inverter 520. In the embodiment where the third current source 527 comprises an n-type MOSFET, the frequency control signal Vctrl and the feedback signal are combined in a manner appropriate for the proper operation of the differential inverter 520, as can be performed by one skilled in the art.

In the preferred embodiment just described, the frequency control signal Vctrl is applied to all three current sources 525, 526 and 527 and the feedback signal Vcmfb is applied to the third current source 527 only. In alternative embodiments of the invention, the frequency control signal Vctrl and the feedback signal Vcmfb may be applied to the current sources in a different manner.

In a first alternative embodiment, the frequency control signal Vctrl is applied to the first, second and third current sources 525, 526 and 527 and the feedback signal Vcmfb is applied to the first and second current sources 525 and 526. In a second alternative embodiment, the frequency control signal Vctrl is applied to the first and second current sources 525 and 526 and the feedback signal Vcmfb is applied to the third current source 527. In a third alternative embodiment, the frequency control signal Vctrl is applied to the third current source 527 and the feedback signal Vcmfb is applied to the first and second current sources 525 and 526. More generally, the particular connections and voltage levels appropriate for the frequency control signal Vctrl and the feedback signal Vcmfb depend upon the implementation of the differential inverter 520 and can be determined by one skilled in the art.

As shown in FIG. 5, a virtual ground node VG is formed at the point where the sources of the input transistors 521 and 522, the sources of the folded load transistors 523 and 524 and the third current source 527 connect. Virtual ground nodes are well-known in the art of differential circuit design, and thus will not be explained further.

The common-mode feedback (CMFB) circuit 540 of the differential delay circuit 410 is used to ensure the proper operation of the differential inverter 520. The CMFB circuit 540 compares the common-mode voltage Vcm of the differential output signal Vout with the reference voltage signal Vref and based on this comparison, generates a feedback signal Vcmfb. Thus, Vcmfb=Vcm−Vref. The feedback signal Vcmfb is used to control the common-mode voltage Vcm of the differential output signal Vout produced by the differential inverter 520 such that Vcm remains at a level appropriate for the proper operation of the differential inverter 520. In a preferred embodiment of the invention, the feedback signal Vcmfb controls the output current of the third current source 527, which in turn controls the common-mode voltage Vcm of the differential output signal Vout. The CMFB circuit 540 is a type of feedback circuit that is well-known in the art and thus need not be described in detail.

The operation of the differential delay circuit 410 will now be described. As mentioned earlier, the differential delay circuit 410 inverts and delays the differential input signal Vin to produce the differential output signal Vout. When the differential input signal Vin is set to a logic value of "1", the first input terminal (indicated by Vin+) assumes a differentially high voltage and the second input terminal (indicated by Vin−) assumes a differentially low voltage. The differentially high voltage at the first input terminal turns the first input transistor 521 "on" (i.e., the conducting state), thereby steering a bias current away from the first load transistor 523. As a result, the first output terminal (indicated by Vout−) is pulled low by the third current source 527 to a differentially low voltage. The differentially low voltage at the second input terminal turns the second input transistor 522 "off" (i.e., the non-conducting state), thereby steering the bias current through the second load transistor 524. As a result, the second output terminal (indicated by Vout+) is pulled high by the second current source 526 to a differentially high voltage. Consequently, when the differential input signal Vin assumes the logic value of "1", the differential output signal Vout switches to the logic value of "0" after the phase delay ΔT.

Conversely, when the differential input signal Vin is set to the logic value of "0", the first input terminal assumes a differentially low voltage and the second input terminal assumes a differentially high voltage. The differentially low voltage at the first input terminal turns the first input transistor 521 off, thereby steering a bias current through the first load transistor 523. As a result, the first output terminal is pulled high by the first current source 525 to a differentially high voltage. The differentially high voltage at the second input terminal turns the second input transistor 522 on, thereby steering the bias current away from the second load transistor 524. As a result, the second output terminal is pulled low by the third current source 527 to a differentially low voltage. Consequently, when the differential input signal Vin assumes the logic value of "0", the differential output signal Vout switches to the logic value of "1" after the phase delay ΔT.

The phase delay ΔT between the differential input signal Vin and the differential output signal Vout can be adjusted by varying the voltage of the frequency control signal Vctrl. The frequency control signal Vctrl varies the current produced by the first, second and third current sources 525, 526 and 527, thereby varying the phase delay ΔT of the differential delay circuit 410. The particular voltage levels appropriate for the frequency control signal Vctrl depend upon the implementation of the differential inverter 520 and can be determined by one skilled in the art.

In a preferred embodiment of the invention, the differential delay circuit 410 is implemented on an integrated circuit that includes guard rings or substrate taps (not shown) connected to the ground terminal. The guard rings or substrate taps, which are physical structures that consist of highly-doped regions of the substrate as is known in the art, are placed adjacent to and surrounding the transistors 521, 522, 523 and 524 of the differential delay circuit. The guard rings or substrate taps are connected to the ground terminal so that any noise coupled through the substrate, such as from adjacent digital circuits, is shunted to ground, rather than being coupled to the transistors 521, 522, 523 and 524 and possibly coupled to the differential output signal Vout. The noise originating from the ground terminal is prevented from entering the differential delay circuit 410 by the third current source 527, as described earlier. Consequently, in addition to rejecting voltage supply and ground noise, the differential delay circuit 410 in this embodiment also rejects substrate noise.

To verify the operation of the differential delay circuit 410, computer simulations of both the conventional VCO 100 and the VCO 400 of the present invention were performed using SPICE. The conventional VCO 100 includes the differential inverter 210 shown in FIG. 2. The VCO 400 includes the differential delay circuit 410 shown in FIG. 5. The simulation results show that the level of noise rejection from both the voltage supply VDD and ground provided by the VCO 400 is about 8 dB higher than that of the conventional VCO 100.

While specific embodiments of the invention have been described and illustrated, it will be appreciated that modifications can be made to these embodiments without departing from the spirit of the invention. Therefore, it is intended that the scope of the invention be defined by the following claims and their equivalents.

What is claimed is:

1. A ring oscillator circuit, comprising:
   a plurality of differential delay circuits interconnected in a ring configuration, wherein each differential delay circuit generates a differential output signal and is coupled to first and second power supply terminals and includes:
   first and second input transistors for receiving a differential input signal;
   first and second load transistors coupled in parallel with the first and second input transistors, respectively;
   a first current source coupled between the first input transistor and the first power supply terminal;
   a second current source coupled between the second input transistor and the first power supply terminal; and
   a third current source coupled between the first and second input transistors and the second power supply terminal.

2. The ring oscillator circuit of claim 1, wherein:
   the first power supply terminal comprises a voltage supply terminal; and
   the second power supply terminal comprises a ground terminal.

3. The ring oscillator circuit of claim 1, wherein the first and second load transistors of each differential delay circuit are each diode-connected.

4. The ring oscillator circuit of claim 1, wherein the first and second load transistors of each differential delay circuit each comprise a folded load transistor.

5. The ring oscillator circuit of claim 1, wherein the third current source of each differential delay circuit operatively generates a current that is about twice as large as a current operatively generated by the first or second current sources.

6. The ring oscillator circuit of claim 1, wherein each differential delay circuit further comprises a common-mode feedback circuit for comparing a common-mode voltage of the differential output signal to a reference voltage signal generated by a reference-voltage circuit and for generating a feedback signal based upon the comparison.

7. The ring oscillator circuit of claim 6, wherein:
   at least one of the first, second and third current sources of each differential delay circuit includes a control input for receiving the feedback signal; and
   the at least one current source of each differential delay circuit generates a current that is responsive to the feedback signal.

8. The ring oscillator circuit of claim 1, wherein:
   at least one of the first, second and third current sources of each differential delay circuit includes a control input for receiving a frequency control signal; and
   the at least one current source of each differential delay circuit generates a current that is responsive to the frequency control signal;
   the ring oscillator circuit thereby comprising a voltage-controlled oscillator circuit.

9. The ring oscillator circuit of claim 1, wherein the first and second input transistors of each differential delay circuit each comprise a MOSFET.

10. The ring oscillator circuit of claim 1, wherein the first and second load transistors of each differential delay circuit each comprise a MOSFET.

11. The ring oscillator circuit of claim 1, wherein the first, second and third current sources of each differential delay circuit each comprise a MOSFET.

12. A voltage-controlled oscillator circuit, comprising:
   a plurality of differential delay circuits interconnected in a ring configuration, wherein each differential delay circuit generates a differential output signal and is coupled to first and second power supply terminals and includes:
   first and second input transistors for receiving a differential input signal;
   first and second load transistors coupled in parallel with the first and second input transistors, respectively;
   a first current source coupled between the first input transistor and the first power supply terminal;
   a second current source coupled between the second input transistor and the first power supply terminal; and
   a third current source coupled between the first and second input transistors and the second power supply terminal.

13. The voltage-controlled oscillator circuit of claim 12, wherein:
   the first power supply terminal comprises a voltage supply terminal; and
   the second power supply terminal comprises a ground terminal.

14. The voltage-controlled oscillator circuit of claim 12, wherein the first and second load transistors of each differential delay circuit are each diode-connected.

15. The voltage-controlled oscillator circuit of claim 12, wherein the first and second load transistors of each differential delay circuit each comprise a folded load transistor.

16. The voltage-controlled oscillator circuit of claim 12, wherein the third current source of each differential delay circuit operatively generates a current that is about twice as large as a current operatively generated by the first or second current sources.

17. The voltage-controlled oscillator circuit of claim 12, wherein each differential delay circuit further comprises a common-mode feedback circuit for comparing a common-mode voltage of the differential output signal to a reference voltage signal generated by a reference voltage circuit and for generating a feedback signal based upon the comparison.

18. The voltage-controlled oscillator circuit of claim 17, wherein:
   at least one of the first, second and third current sources of each differential delay circuit includes a control input for receiving the feedback signal; and
   the at least one current source of each differential delay circuit generates a current that is responsive to the feedback signal.

19. The voltage-controlled oscillator circuit of claim 12, wherein:
   at least one of the first, second and third current sources of each differential delay circuit includes a control input for receiving a frequency control signal; and
   the at least one current source of each differential delay circuit generates a current that is responsive to the frequency control signal.

20. The voltage-controlled oscillator circuit of claim 12, wherein the first and second input transistors of each differential delay circuit each comprise a MOSFET.

21. The voltage-controlled oscillator circuit of claim 12, wherein the first and second load transistors of each differential delay circuit each comprise a MOSFET.

22. The voltage-controlled oscillator circuit of claim 12, wherein the first, second and third current sources of each differential delay circuit each comprise a MOSFET.

23. A differential delay circuit coupled to first and second power supply terminals, the differential delay circuit generating a differential output signal and comprising:

first and second input transistors for receiving a differential input signal;

first and second load transistors coupled in parallel With the first and second input transistors, respectively;

a first current source coupled between the first input transistor and the first power supply terminal;

a second current source coupled between the second input transistor and the first power supply terminal; and a third current source coupled between the first and second input transistors and the second power supply terminal.

24. The differential delay circuit of claim 23, wherein:

the first power supply terminal comprises a voltage supply terminal; and the second power supply terminal comprises a ground terminal.

25. The differential delay circuit of claim 23, wherein the first and second load transistors are each diode-connected.

26. The differential delay circuit of claim 23, wherein the first and second load transistors each comprise a folded load transistor.

27. The differential delay circuit of claim 23, further comprising a common-mode feedback circuit for comparing a common-mode voltage of the differential output signal to a reference voltage signal generated by a reference voltage circuit and for generating a feedback signal based upon the comparison.

28. The differential delay circuit of claim 27, wherein:

at least one of the first, second and third current sources includes a control input for receiving the feedback signal; and the at least one current source generates a current that is responsive to the feedback signal.

29. The differential delay circuit of claim 23, wherein:

at least one of the first, second and third current sources includes a control input for receiving a frequency control signal; and the at least one current source generates a current that is responsive to the frequency control signal.

30. The differential delay circuit of claim 23, wherein the third current source operatively generates a current that is about twice as large as a current operatively generated by the first or second current sources.

31. The differential delay circuit of claim 23, wherein the first and second input transistors each comprise a MOSFET.

32. The differential delay circuit of claim 23, wherein the first and second load transistors each comprise a MOSFET.

33. The differential delay circuit of claim 23, wherein the first, second and third current sources each comprise a MOSFET.

* * * * *

UNITED STATES PATENT AND TRADEMARK OFFICE
CERTIFICATE OF CORRECTION

PATENT NO.    : 6,414,557 B1
DATED         : July 2, 2002
INVENTOR(S)   : Bin Liu It is certified that error appears in the above-identified patent and that said Letters Patent is hereby corrected as shown below:

<u>Column 9,</u>
Line 44, replace "reference-voltage" with -- reference voltage --.

Signed and Sealed this

Seventeenth Day of June, 2003

JAMES E. ROGAN
*Director of the United States Patent and Trademark Office*